United States Patent [19]

Byun

[11] Patent Number: 5,665,209
[45] Date of Patent: Sep. 9, 1997

[54] METHOD FOR FORMING REFRACTORY METAL NITRIDE FILM

[75] Inventor: Jeong Soo Byun, Chungcheongbuk-do, Rep. of Korea

[73] Assignee: LG Semicon Co., Ltd., Chungcheongbuk-do, Rep. of Korea

[21] Appl. No.: 437,893

[22] Filed: May 10, 1995

[51] Int. Cl.$^6$ .................................................. C23C 14/00
[52] U.S. Cl. ........................ 204/192.17; 204/192.16; 204/192.21; 438/653; 438/685
[58] Field of Search .................... 148/237; 437/192; 204/192.16, 192.17, 192.21

[56] References Cited

U.S. PATENT DOCUMENTS

| | | | |
|---|---|---|---|
| 4,513,905 | 4/1985 | Nowicki et al. | 204/192.17 |
| 5,232,522 | 8/1993 | Doktycz et al. | 148/237 |

FOREIGN PATENT DOCUMENTS

| | | | |
|---|---|---|---|
| 598422 | 5/1994 | European Pat. Off. | 204/192.17 |
| 59-55016 | 3/1984 | Japan | 204/192.17 |

OTHER PUBLICATIONS

"Deposition and Properties of Reactively Sputtered Ruthenium Dioxide Films", Keizo Sakiyama et al., J. Electrochem. Soc., 140(3):834–839 (1993).

"Barrier Metals for ULSI: Deposition and Manufacturing", Dipanker Pramanik et al., Solid State Technology, pp. 73–76, 79 and 82, Jan. 1993.

*Primary Examiner*—Deborah Yee
*Attorney, Agent, or Firm*—Finnegan, Henderson, Farabow, Garrett & Dunner, L.L.P.

[57] ABSTRACT

A method for forming a refractory metal nitride film having excellent diffusion barrier properties suitable for a dielectric electrode includes a step of depositing a refractory metal film containing nitrogen on a silicon substrate in a mixed gas atmosphere of Ar and $N_2$, such that the volumetric content of the nitrogen in the mixed gas does not exceed 20%, and a step of forming a completed refractory metal film by subjecting the refractory metal film to a heat treatment in an $N_2$ or $NH_3$ atmosphere. The content of nitrogen in the refractory metal film depends on the content of nitrogen in the ambient gas, and the ratio of nitrogen contained in the refractory metal film to the refractory metal does not exceed unity. The refractory metals may be any of the transition metals in Groups IVB, VB, and VIB of the periodic table.

11 Claims, 10 Drawing Sheets

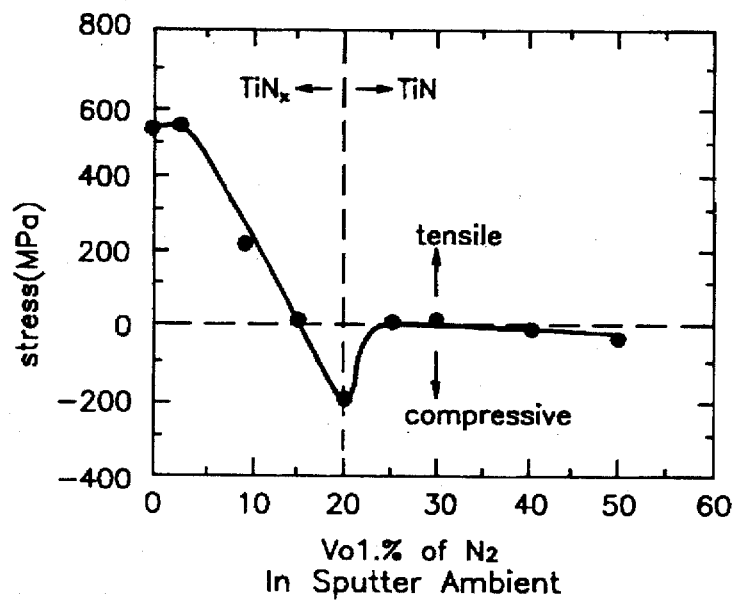
FIG.2 prior art
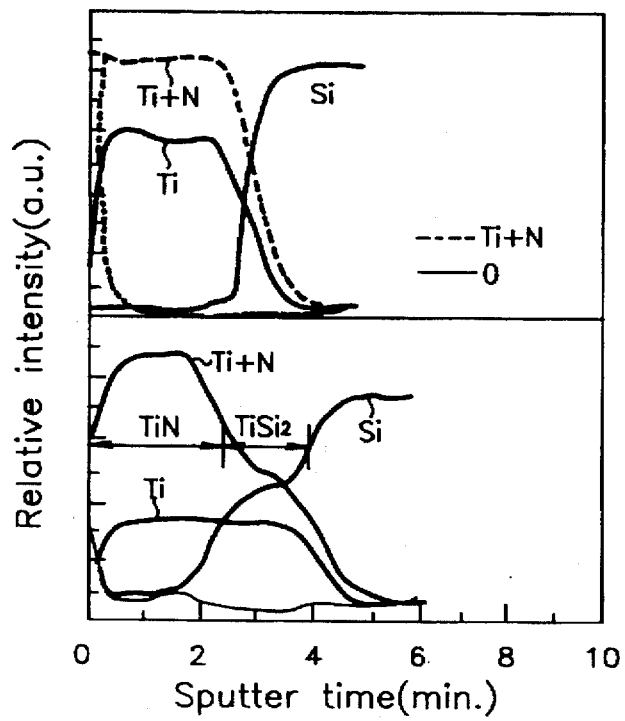
FIG.5A
FIG.5B

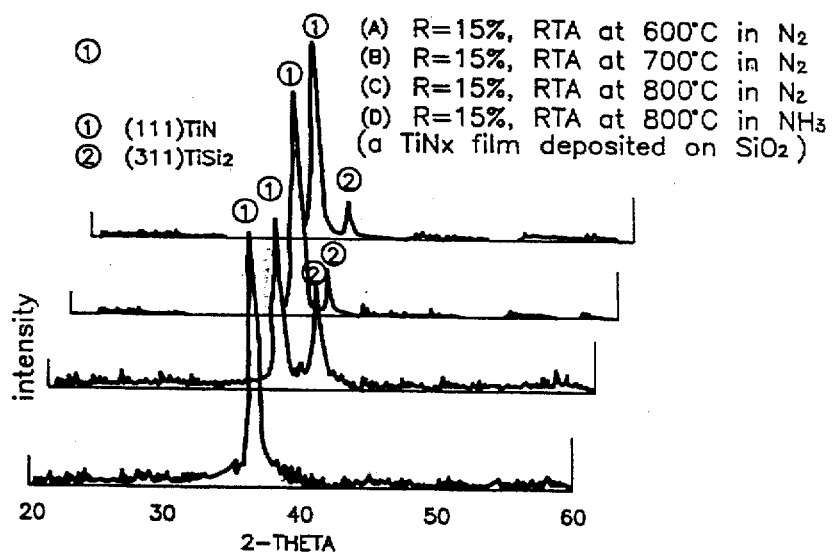

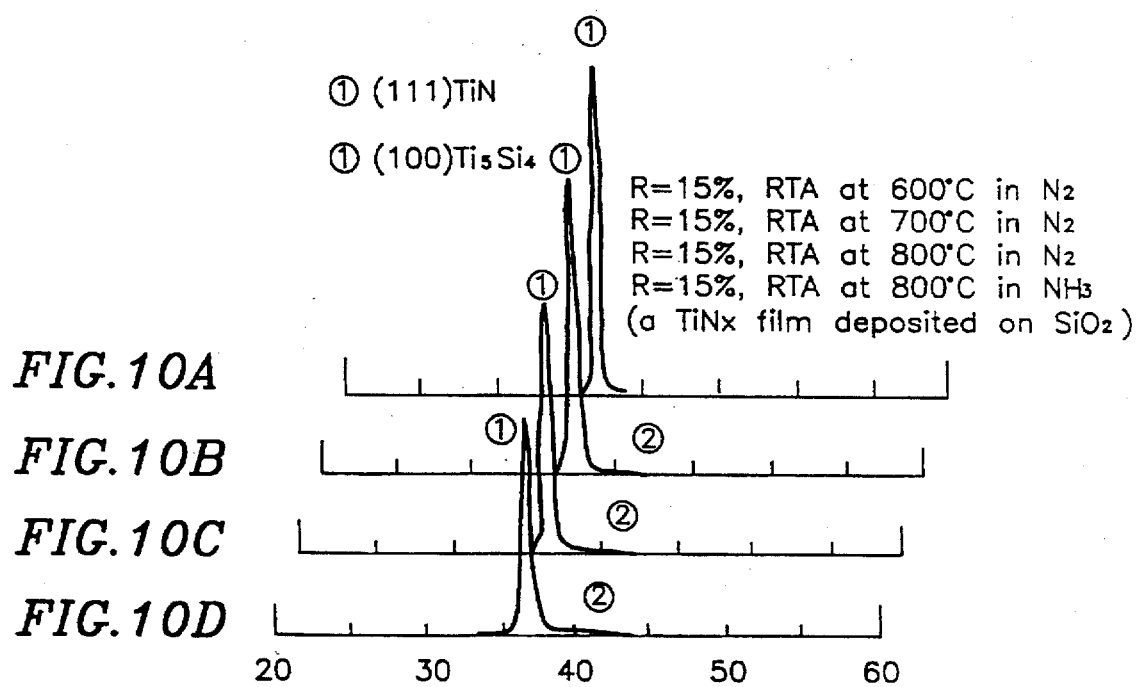

METHOD FOR FORMING REFRACTORY METAL NITRIDE FILM

BACKGROUND OF THE INVENTION

This invention relates to a method for forming a refractory metal nitride film, and more particularly to a method for forming a refractory metal nitride film having excellent diffusion barrier properties suitable for a dielectric electrode.

A refractory metal nitride film, such as a TiN film or a ZrN film, has been used as a diffusion barrier layer for metals, such as copper, and ferroelectric dielectrics, such as BST ($BaSrO_3$).

Conventionally, the TiN film or the ZrN film has been deposited using a reactive sputtering method in an excessive $N_2$ atmosphere. A TiN or ZrN film formed according to this method has a columnar structure having fine grains as shown in FIG. 5B.

The TiN films and the ZrN films formed according to the conventional reactive sputtering method can not act as perfect diffusion barriers due to the formation of pin holes caused by diffusion along the grain boundaries of the films.

Further, the TiN films and the ZrN films formed according to the conventional reactive sputtering method exhibit decreased electrical conductivity due to the substantially great resistivity of the columnar structure, as compared with single crystal TiN or ZrN films.

SUMMARY OF THE INVENTION

The object of this invention is to provide a method for forming a refractory metal nitride film that has excellent electrical conductivity and diffusion barrier properties suitable for use as a dielectric electrode.

These and other objects and features of this invention can be achieved by providing a method for forming a refractory metal nitride film, including a step of depositing a refractory metal film containing nitrogen on a silicon substrate in a mixed gas atmosphere of Ar and $N_2$ under a condition that the volumetric content of the nitrogen in the mixed gas does not exceed 20%, and a step of forming a completed refractory metal film by subjecting the refractory metal film to a heat treatment in an $N_2$ or $NH_3$ atmosphere.

The nitrogen content in the refractory metal film is a function of the nitrogen content in the ambient gas. Preferably, the nitrogen to refractory metal ratio contained in the refractory metal film does not exceed unity. The refractory metals may be any of the transition metals in Groups IVB, VB, and VIB of the periodic table.

BRIEF DESCRIPTION OF THE DRAWINGS

FIG. 2 shows variations of stress in a deposited film as a function of nitrogen content in the ambient gas of the conventional sputtering process.

FIGS. 5A and 5B are graphs showing AES depth analyses of a $TiN_x$ film, such as that shown in FIGS. 3A and 3B deposited in an atmosphere containing 15 volumetric % of nitrogen in the sputter ambient gas, before and after heat treatment.

FIGS. 9A-9D show XRD spectrums of $TiN_x$ films deposited on a silicon substrate and subjected to heat treatments as follows: A) 600 deg. C. in a nitrogen atmosphere; B) 700 deg. C. in a nitrogen atmosphere; C) 800 deg.C in a nitrogen atmosphere; and D) 800 deg. C. in an $NH_3$ atmosphere.

FIGS. 10A-10D show XRD spectrums of $TiN_x$ films deposited on a silicon oxide film and subjected to heat treatments as follows: A) 600 deg. C. in a nitrogen atmosphere at different temperatures; B) 700 deg. C. in a nitrogen atmosphere; C) 800 deg. C. in a nitrogen atmosphere; and D) 800 deg. C. in an $NH_3$ atmosphere.

DETAILED DESCRIPTION OF THE INVENTION

Figure 1:
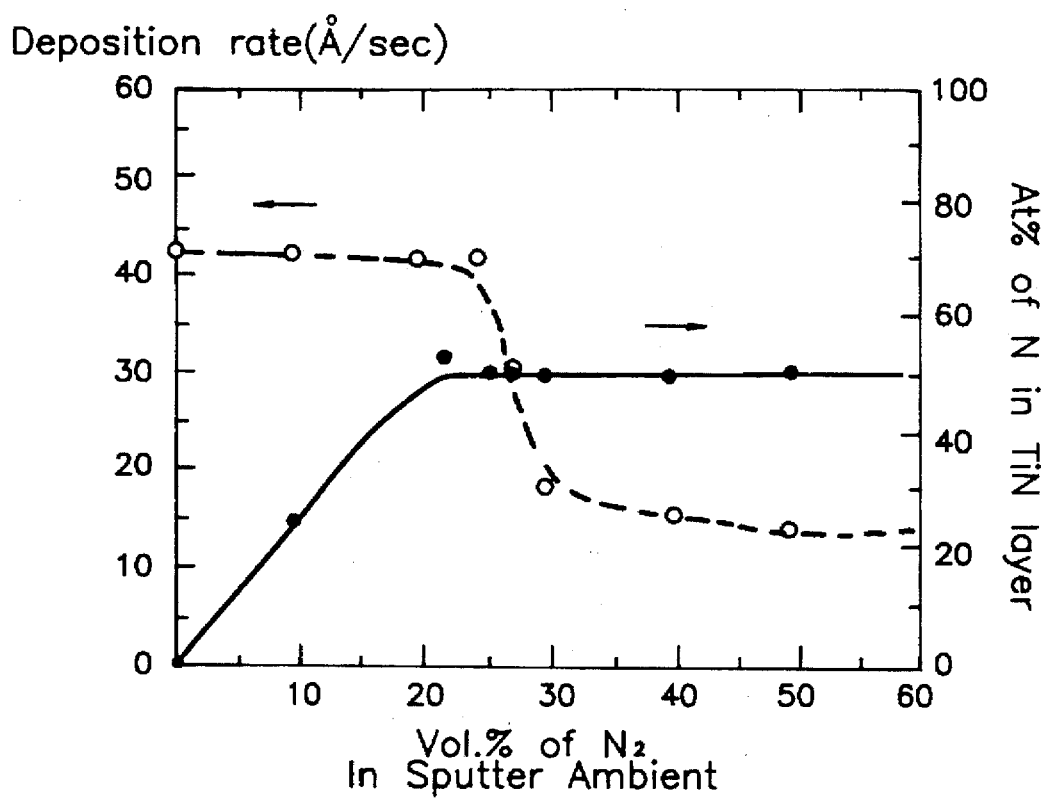
FIG. 1 shows the film deposition rate and nitrogen atom content in the deposited film as a function of nitrogen content in an ambient gas of a conventional sputtering process.

FIG. 1 shows a film deposition rate and % nitrogen atom content of a deposited refractory metal nitride film as a function of variation of vol. % nitrogen content in the ambient gas during a sputtering process. Herein, the nitrogen content in the sputter ambient gas is a volumetric ratio of nitrogen to entire sputter ambient gas($Ar+N_2$), and is denoted in units of volume %.

Referring to FIG. 1, it can be seen that, when the sputtering process is carried out within a range of $0<N_2<20$ vol. % of the entire sputter ambient gas, a $TiN_x$ film is deposited on a substrate at a constant rate irrespective of the increase in the content of nitrogen in the sputter ambient gas. FIG. 1 further shows that the content of nitrogen in the deposited $TiN_x$ ($0<x<1$) film increases linearly when the above range is exceeded, i.e., when the nitrogen gas content exceeds 20 vol. %, a TiN film is formed on the surface of the titanium target, resulting in a sharp drop in the deposition rate.

The $TiN_x$ ($0<x<1$) film deposited with a sputtering method in an atmosphere of Ar and $N_2$ ($0<N_2<20$ vol. %) is not a titanium nitride film (TiN film), but rather a titanium film having nitrogen atoms distributed within the lattice. The content of the nitrogen atoms in the $TiN_x$ film increases proportionally to the content of the nitrogen in the ambient gas as shown in FIG. 1.

Further, the stress in the $TiN_x$ film decreases linearly as the nitrogen content increases within the above range; becoming zero when the nitrogen content is 15 vol. %.

Figure 3A:
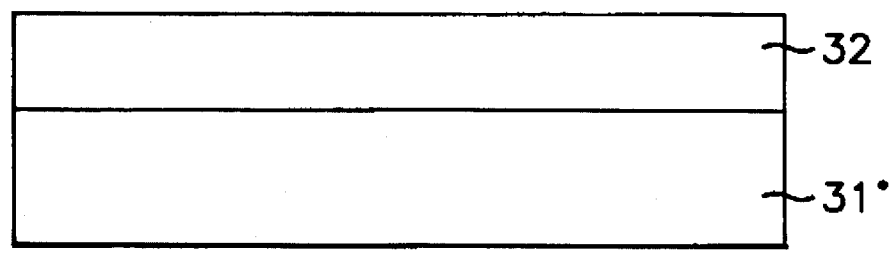
FIGS. 3A and 3B show a refractory metal nitride film formed in accordance with one embodiment of this invention.
Figure 3B:
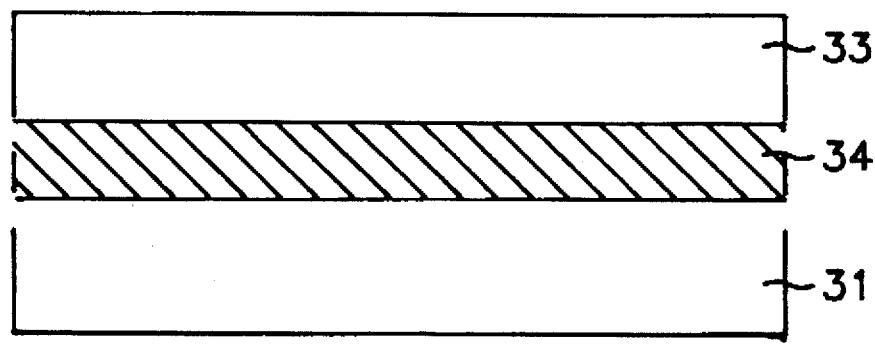

FIGS. 3A and 3B illustrate a refractory metal nitride film formed in accordance with a first embodiment of this invention.

Referring to FIG. 3A, a refractory metal film 32 containing nitrogen (hereinafter called '$RN_x$' film) is deposited on a silicon substrate 31 under a condition that content of the nitrogen gas in the sputter ambient gas is $0<N_2<20$ vol. %. The content x of nitrogen N in the deposited $RN_x$ film 32 is a function of the nitrogen content in the ambient gas during deposition of the thin film, and preferably satisfies the range of 0<x<1. Herein, the $RN_x$ film 32 is not a refractory metal nitride film but a refractory metal film having nitrogen contained in the lattice. The $RN_x$ film 32 is deposited on a silicon substrate 31 by sputtering in a mixed gas atmosphere of Ar and $N_2$.

Any of the transition elements in Groups IVB, VB, and VIB of the periodic table may be used as a refractory metal for forming the $RN_x$ film 32.

Referring to FIG. 3B, a RN film 33 is formed by subjecting the $RN_x$ film 32 deposited on the silicon substrate 31 to a heat treatment process in an atmosphere of $N_2$ and $NH_3$. The heat treatment process is carried out at a temperature of 200 to 1000 deg. C. more than once. Herein, the RN film 33 is a refractory metal nitride film. Further, with the heat treatment process carried out, $RSi_2$ 34, a refractory silicide, is formed at the interface of the silicon substrate 31 and the RN film 33.

FIGS. 5A and 5B are graphs showing AES depth analyses of a $TiN_x$ film, such as that shown in FIGS. 3A and 3B deposited under a condition that nitrogen content in the sputter ambient gas is 15 vol. %. FIG. 5A shows a condition before the heat treatment, and FIG. 5B shows a condition after the heat treatment.

Referring to FIGS. 5A and 5B, it can be seen that a film containing nitrogen had been formed on a silicon substrate before the heat treatment, whereas the $TiN_x$ film has been transformed into a TiN film and titanium silicide has been formed at the interface of the substrate and the TiN film after the heat treatment.

Figure 7A:
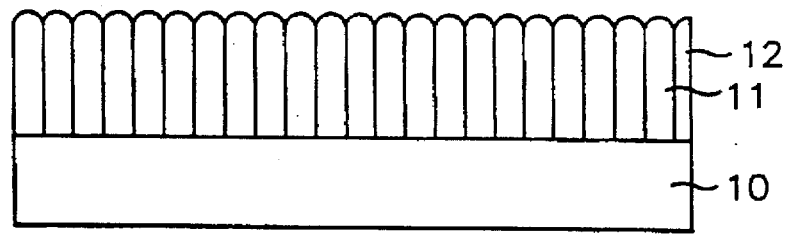
FIGS. 7A-7C show schematic crystal structures of titanium nitride films formed in accordance with this invention and with the conventional reactive sputtering method.
Figure 7B:
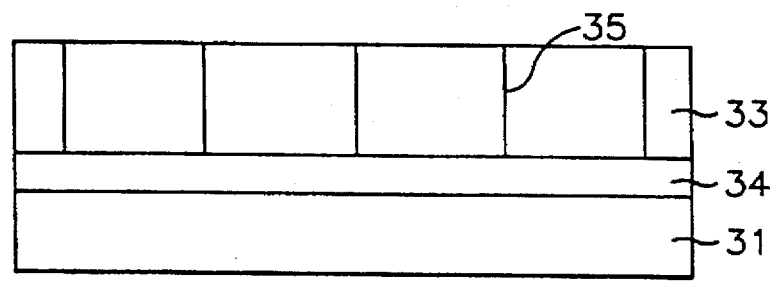

Referring to FIG. 7A, when a TiN film 11 is deposited on a silicon substrate 10 by a conventional reactive sputtering method, TiN, formed during initial stages of deposition, has a columnar structure of fine grains after heat treatment. As shown in FIG. 7B, and contrary to conventional methods, in this invention the $TiN_x$ film having nitrogen distributed in the lattice of a titanium film is formed at the initial stages of deposition resulting in a TiN film 34 having larger grain sizes after a heat treatment process.

The TiN film 11 having a columnar structure of fine grain sizes, as shown in FIG. 7A, cannot act as an excellent diffusion barrier due to extensive diffusion along the grain boundaries 12. The TiN film 33 as shown in FIG. 7B, however, can act as an excellent diffusion barrier because the TiN film 33 having a columnar structure of larger grain sizes does not readily permit diffusion through grain boundaries 35 as compared to the film in FIG. 7A.

Figure 4A:
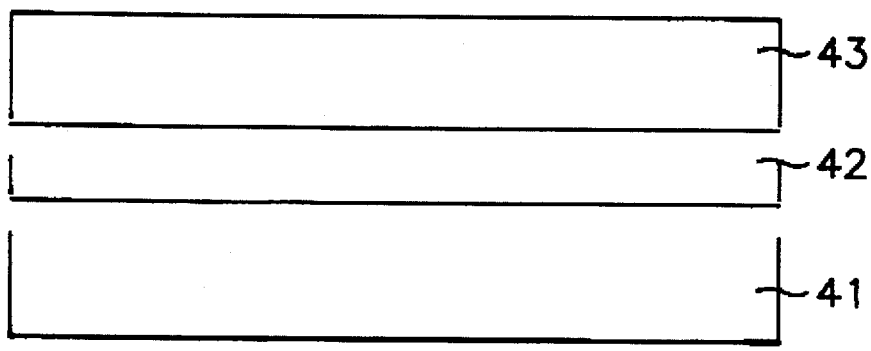
FIGS. 4A and 4B show a refractory metal nitride film formed in accordance with another embodiment of this invention.

Referring to FIG. 4A, a silicon oxide film 42 is formed on a silicon substrate 41, and a refractory metal film 43 containing nitrogen (hereinafter called '$RN_x$' film) is deposited on the silicon oxide film 42 under a condition that the nitrogen content in the sputter ambient gas is $0<N_2<20$ vol. %. In this case, as in the foregoing case, the content, x, of nitrogen N in the deposited $RN_x$ film 43 is a function of the nitrogen content in the ambient gas during deposition of the thin film, and preferably satisfies the range of 0<x<1. Herein, the $RN_x$ film 32 is not a refractory metal nitride film, but rather a refractory metal film having nitrogen contained in the lattice. The $RN_x$ film 43 is sputtered in a mixed gas atmosphere of Ar and $N_2$ gases.

Any of the transition elements in IVB, VB, and VIB groups of the periodic table may be used as a refractory metal for forming the $RN_x$ film 43.

Figure 4B:
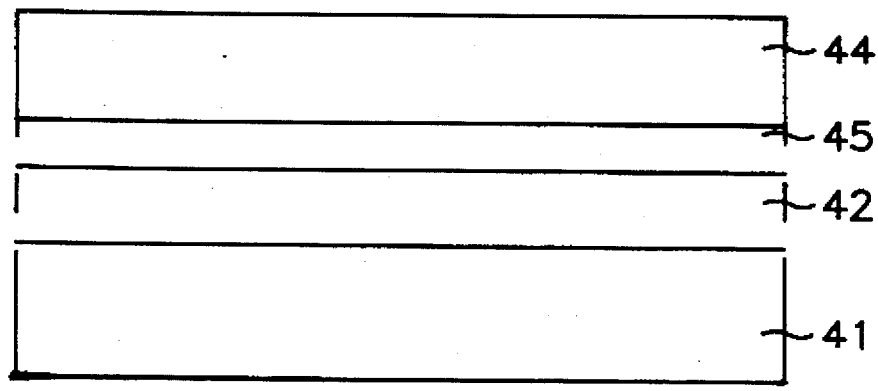

Referring to FIG. 4B, a RN film 44 is formed by subjecting the $RN_x$ film 43 deposited on the silicon oxide film 42 to a heat treatment process in an atmosphere of $N_2$ and $NH_3$. The heat treatment process is carried out at a temperature of 200 to 1000 deg. C, more than once. When the heat treatment process is carried out, a refractory metal oxide film 45 is formed at the interface of the silicon oxide film 42 and the RN film 44.

Figure 6:
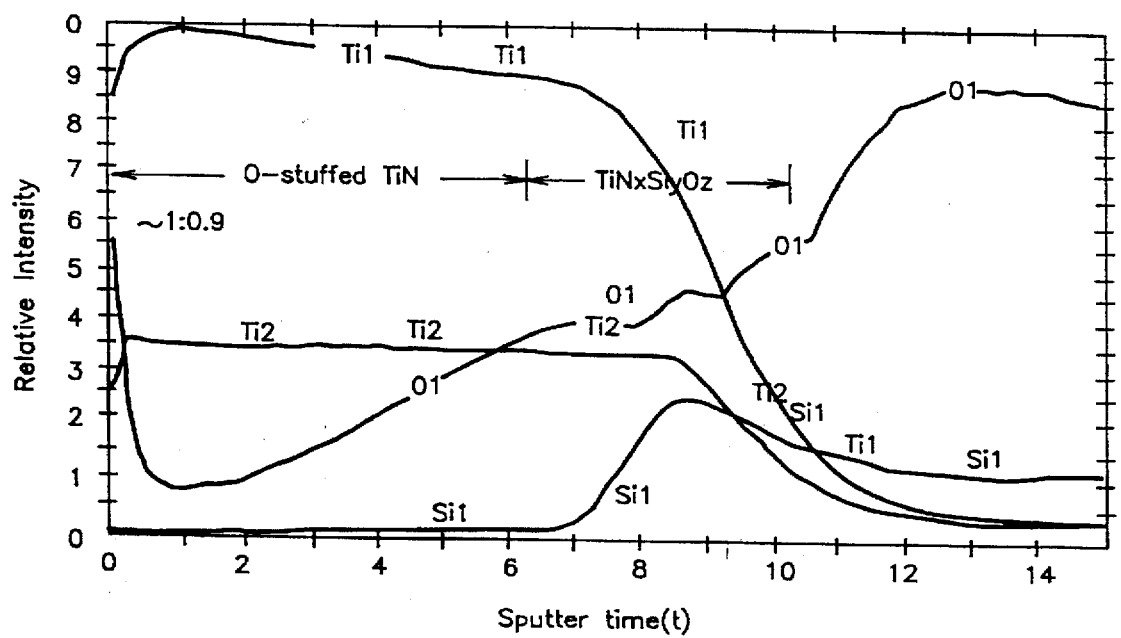
FIG. 6 is a graph showing AES depth analyses a $TiN_x$ film, such as the shown in FIGS. 4A and 4B deposited in an atmosphere containing 15 volumetric % of nitrogen in the sputter ambient gas, after heat treatment at 700 deg. C.

FIG. 6 is a graph showing AES depth analyses of a $TiN_x$ film such as that shown in FIGS. 4A and 4B deposited in an atmosphere containing 15 vol % nitrogen in the sputter ambient gas and subjected to a heat treatment at 700 deg.C.

Referring to FIG. 6, as has been explained in FIGS. 4A and 4B, the TiN film is formed on the silicon oxide film, and the titanium oxide film ($TiN_xSi_yO_z$) film is formed at the interface of the TiN film and the silicon oxide film. Ti has a greater tendency to oxidize than silicon, therefore a titanium oxide film is preferentially formed at the interface as a result of reduction of the silicon oxide film.

Figure 7C:
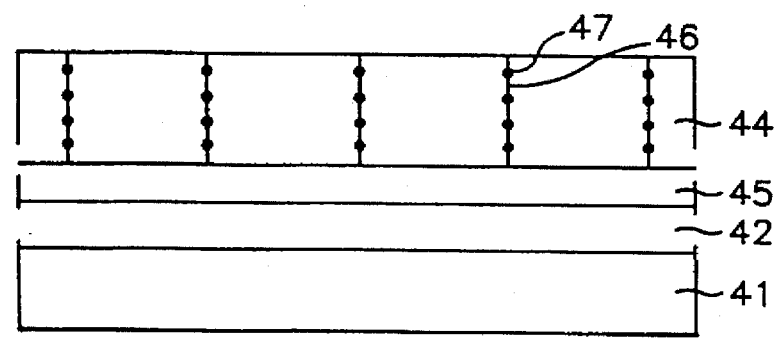

As shown in FIG. 7C, the TiN film 44 has a columnar structure having larger grain sizes similar to the film shown in FIG. 7B after the heat treatment is carried out. The TiN film 44 exhibits excellent diffusion barrier properties as well as excellent electric conduction properties due to the oxygen-rich 47 grain boundaries 46 which block diffusion through the grain boundaries. The titanium oxide film 45, formed at the interface, further improves the diffusion barrier properties of the titanium nitride film 44.

Differences due to the different grain structures of the titanium nitride films obtained in accordance with this invention and those obtained with conventional reactive sputtering method are to be explained hereinafter, referring to FIGS. 8A to 11.

Figure 8A:
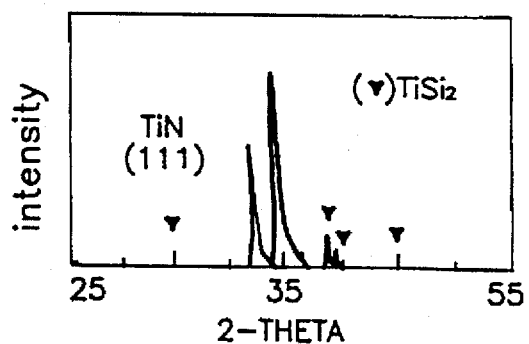
FIGS. 8A-8C show XRD spectrums of a pure titanium film, a $TiN_x$ film, and a TiN film, each of which has been subjected to a heat treatment at 700 deg.C.
Figure 8B:
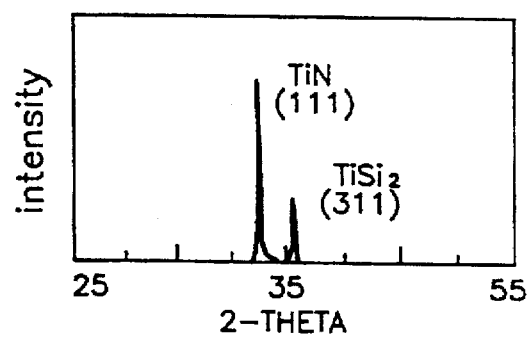
Figure 8C:
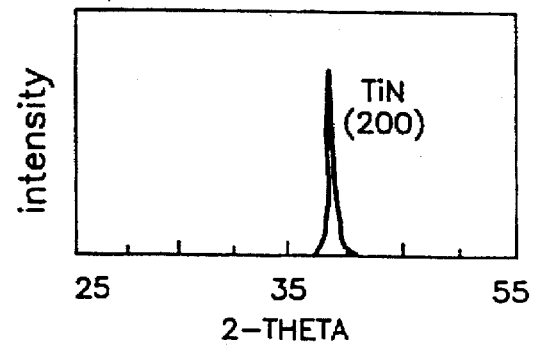

FIG. 8A shows an X ray spectrum of a pure titanium film deposited on a substrate and subjected to a heat treatment at 700 deg. C. FIG. 8B shows an X ray spectrum of a $TiN_x$ film deposited on a substrate and subjected to a heat treatment at 700 deg. C. as according to this invention, and FIG. 8C shows an X ray spectrum of a TiN film deposited on a substrate and subjected to a heat treatment at 700 deg. C. with a conventional sputtering method.

Referring first to FIG. 8A, when the pure titanium film is subjected to heat treatment, a TiN film oriented in the 111 direction is formed, and polycrystalline $TiSi_2$ is formed at the interface. However, only a small amount of TiN film is formed, while a large amount of $TiSi_2$ is formed. In other words, when a titanium film with no nitrogen contained in the lattice is subjected to a heat treatment, the titanium is preferentially altered into $TiSi_2$, rather than TiN.

FIG. 8B shows that when the $TiN_x$ film produced according to this invention is subjected to a heat treatment, a large amount of TiN film is formed, while a small amount of $TiSi_2$ oriented in 311 direction is formed at the interface.

Referring to FIG. 8C, when a TiN film is deposited with a conventional sputtering method and is subjected to a heat treatment, a TiN film oriented in the 200 direction is formed. However, since the TiN film will have a columnar structure as shown in FIG. 7A, as has been explained, the barrier properties are not good.

The instant invention allows one to obtain a TiN film having larger, more uniform grains and excellent diffusion barrier properties by forming a TiN film by initially depositing a titanium film containing nitrogen atoms in the lattice and subjecting it to a heat treatment instead of initially depositing a TiN film.

Accordingly, the diffusion barrier properties in addition to the electrical conduction properties are excellent, and, because the orientation of the crystal is 111, the stability is increased as well.

FIGS. 9A to 9D show X ray spectrums of a TiN$_x$ film deposited on a substrate and subjected to a heat treatment. FIG. 9A shows an X ray spectrum of a film subjected to a heat treatment at 600 deg. C. in an N$_2$ atmosphere, FIG. 9B shows an X ray spectrum of a film subjected to a heat treatment at 700 deg. C. in an N$_2$ atmosphere, FIG. 9C shows an X ray spectrum of a film subjected to a heat treatment at 800 deg. C. in an N$_2$ atmosphere, and FIG. 9D shows an X ray spectrum in which the film is subjected to a heat treatment at 800 deg. C. in an NH$_3$ ambient. As shown in FIGS. 9A to 9D, a large amount of the TiN film having bigger, more uniform grains oriented in the 111 direction is always formed even though the heat treatment temperatures are varied and the heat treatment is carried out in an N$_2$ or an NH$_3$ atmosphere.

FIGS. 10A to 10D show X ray spectrums of TiN$_x$ films deposited on silicon oxide and subjected to heat treatment. FIG. 10A shows an X ray spectrum of a film subjected to a heat treatment at 600 deg. C. in an N$_2$ atmosphere, FIG. 10B shows an X ray spectrum of a film subjected to a heat treatment at 700 deg. C. in an N$_2$ atmosphere, FIG. 10C shows an X ray spectrum of a film subjected to a heat treatment at 800 deg. C. in an N$_2$ atmosphere, and FIG. 10D shows an X ray spectrum of a film subjected to a heat treatment at 800 deg. C. in an NH$_3$ atmosphere.

As shown in FIGS. 10A to 10D, a large amount of the TiN film having larger, more uniform grains oriented in the 111 direction will be formed even though the heat treatment temperature is varied and carried out in an N$_2$ or an NH$_3$ atmosphere. A TiN film formed on a silicon oxide film has the same desirable properties as a TiN film formed on a silicon substrate.

The foregoing result is consistent with the AES analyses shown in FIGS. 5A to 6.

Figure 11:
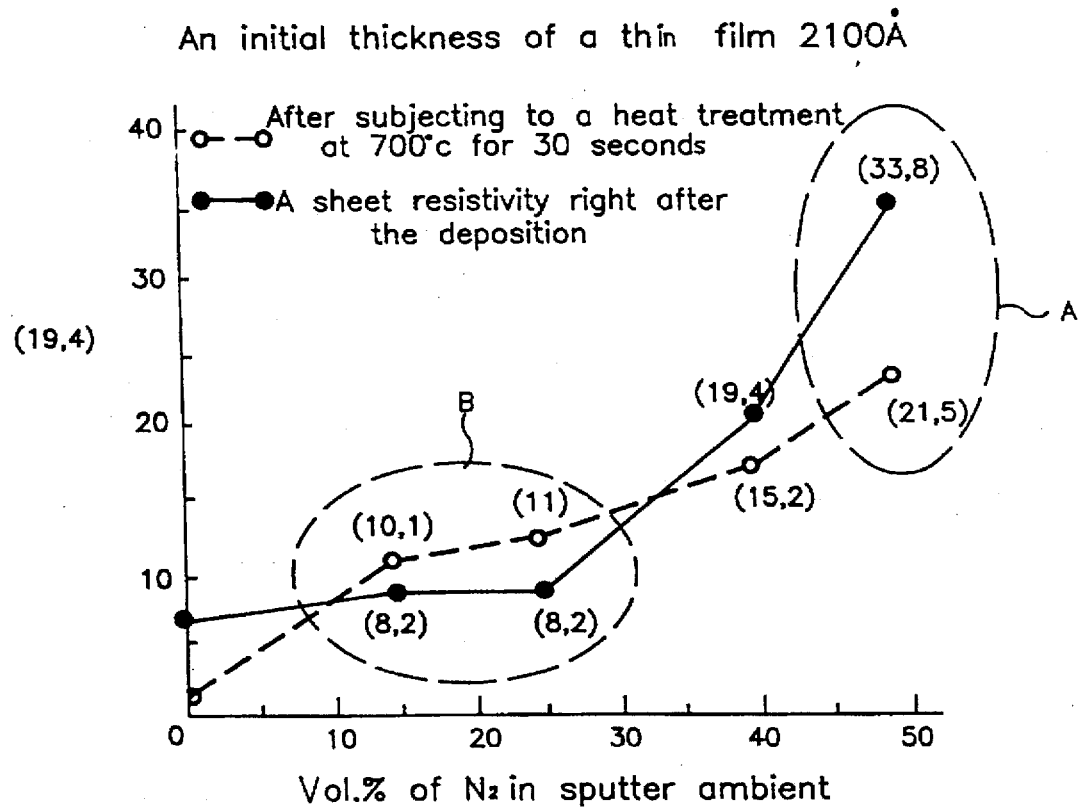
FIG. 11 is a graph showing the resistivity of a TiN film as a function of nitrogen content in a sputter ambient gas.

FIG. 11 is a graph comparing the barrier properties of TiN films formed in accordance with this invention and those formed with the conventional reactive sputtering method.

As shown in FIG. 11, the sheet resistivity of the TiN film formed according to the method of this invention remains substantially unchanged after heat treatment, resulting in excellent barrier properties. The sheet resistivity of a conventional TiN film, however, changes substantially after heat treatment, resulting in the degradation of barrier properties.

The process of this invention produces a refractory metal nitride film having excellent diffusion barrier properties, as well as excellent electric conduction properties. These films can be utilized for a lower electrode of a dielectric electrode by depositing the refractory metal film under the condition that N$_2$ content in the sputter ambient gas is 0<N$_2$<20 vol. % and further subjecting the film to a heat treatment.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a refractory metal nitride film comprising:

depositing a refractory metal film containing nitrogen on a substrate in a mixed gas atmosphere of Ar and N$_2$ having a volumetric content of nitrogen in the mixed gas not exceeding 20%; and subjecting the refractory metal film to a heat treatment.

2. The method as claimed in claim 1, wherein the content of nitrogen in the refractory metal film is a function of the nitrogen content of the mixed gas.

3. The method as claimed in claim 2, wherein the ratio of nitrogen to refractory metal in the refractory metal film does not exceed unity.

4. The method as claimed in claim 1, wherein the heat treatment process is carried out at a temperature of 200 to 1000 deg.C. more than once.

5. The method as claimed in claim 1, wherein the heat treatment process is carried out in an atmosphere of N$_2$ or NH$_3$.

6. The method as claimed in claim 1, wherein the refractory metal of the film is selected from the group consisting of transition metals in Groups IVB, VB, and VIB of the periodic table.

7. The method as claimed in claim 1, wherein the substrate is silicon.

8. The method as claimed in claim 7, wherein refractory metal silicide is formed at an interface of the silicon substrate and the refractory metal nitride film.

9. The method as claimed in claim 7, further comprising a step of depositing a silicon oxide film on the silicon substrate before the step of depositing the refractory metal film.

10. The method as claimed in claim 9, wherein a refractory metal oxide film is formed at an interface of the refractory metal nitride film and the silicon oxide film.

11. A method in accordance with claim 1, wherein the refractory metal film comprises a plurality of oxygen-rich grain boundaries.

* * * * *